United States Patent
Chen et al.

(10) Patent No.: US 9,797,047 B2
(45) Date of Patent: Oct. 24, 2017

(54) COPPER PLATING METHOD

(71) Applicant: Headway Technologies, Inc., Milpitas, CA (US)

(72) Inventors: Chao-Peng Chen, Fremont, CA (US); Jas Chudasama, Milpitas, CA (US); Chien-Li Lin, Fremont, CA (US); David Wagner, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 274 days.

(21) Appl. No.: 14/821,953

(22) Filed: Aug. 10, 2015

(65) Prior Publication Data
US 2015/0345030 A1  Dec. 3, 2015

Related U.S. Application Data

(62) Division of application No. 12/931,854, filed on Feb. 11, 2011, now Pat. No. 9,103,012.

(51) Int. Cl.
*C23F 1/12* (2006.01)
*C23C 14/58* (2006.01)
(Continued)

(52) U.S. Cl.
CPC ............... *C23F 1/12* (2013.01); *C23C 2/02* (2013.01); *C23C 14/5873* (2013.01);
(Continued)

(58) Field of Classification Search
CPC ......... C23F 1/12; C23C 14/5873; C23C 2/02; C25D 5/022; C25D 5/34; G11B 5/17
See application file for complete search history.

(56) References Cited

U.S. PATENT DOCUMENTS 4,850,534 A   7/1989  Takahashi et al.
5,336,363 A * 8/1994  Morita .............. H01L 21/32136
                                                216/78
(Continued)

FOREIGN PATENT DOCUMENTS

JP   2001271192 A * 10/2001

OTHER PUBLICATIONS

"A Novel Method of Etching Copper Oxide Using Acetic Acid," by Dennis W. Hess et al., Georgia Institute of Technology, Oct. 2001, Journal of the Electrochemical Society, 148(11), G640-G643, 0013-4651/2001/148(11)/G640/4.

*Primary Examiner* — Anita Alanko
(74) *Attorney, Agent, or Firm* — Saile Ackerman LLC; Stephen B. Ackerman

(57) ABSTRACT

A method of removing copper oxide from copper surfaces is disclosed that comprises application of vapor generated by an ultrasonic wave nebulizer. The energized vapor droplets include water and a weak organic acid such as acetic acid, lactic acid, citric acid, uric acid, oxalic acid, or formic acid that have a vapor pressure proximate to that of water. The weak organic acid preferably has a pKa high enough to avoid Cu etching but is sufficiently acidic to remove copper oxide at a rate that is compatible with high throughput manufacturing. In one embodiment, weak acid/water vapor is applied to a substrate in a spin bowl and is followed by a deionized water rinse step in the same spin bowl. Improved wettability results in improved uniformity in subsequently plated copper films. Considerable cost savings is realized as a result of reduced chemical consumption and higher product yields.

10 Claims, 4 Drawing Sheets

(51) Int. Cl.
*C23C 2/02* (2006.01)
*C25D 5/02* (2006.01)
*G11B 5/17* (2006.01)
*C25D 5/34* (2006.01)

(52) U.S. Cl.
CPC ............... *C25D 5/022* (2013.01); *C25D 5/34* (2013.01); *G11B 5/17* (2013.01)

(56) References Cited

U.S. PATENT DOCUMENTS

| | | | |
|---|---|---|---|
| 5,482,174 | A | 1/1996 | Namiki et al. |
| 6,033,584 | A | 3/2000 | Ngo et al. |
| 6,117,784 | A * | 9/2000 | Uzoh ................ H01L 21/2855 204/192.15 |
| 6,423,200 | B1 * | 7/2002 | Hymes ................ H01L 21/6723 205/123 |
| 6,664,197 | B2 * | 12/2003 | Stevens ................ B08B 3/04 252/79.1 |
| 6,734,102 | B2 | 5/2004 | Rathi et al. |
| 7,465,408 | B1 * | 12/2008 | Avanzino ................ C23C 22/52 216/100 |
| 7,619,254 | B2 | 11/2009 | Lee et al. |
| 8,771,535 | B2 * | 7/2014 | Yamada ................ G01N 1/2813 134/902 |
| 2008/0142484 | A1 * | 6/2008 | Ming-Wen ................ C23F 1/08 216/108 |
| 2009/0007997 | A1 | 1/2009 | Tyl |
| 2013/0022756 | A1 * | 1/2013 | Augustine ................ C23C 14/02 427/551 |

* cited by examiner

COPPER PLATING METHOD

This is a Divisional application of U.S. patent application Ser. No. 12/931,854, filed on Feb. 11, 2011, which is herein incorporated by reference in its entirety, and assigned to a common assignee.

FIELD OF THE INVENTION

The invention relates to a method of removing copper oxide from a copper seed layer that reduces chemical consumption and overetching, and improves plating uniformity in a subsequent copper plating process.

BACKGROUND OF THE INVENTION

Copper is widely used in the fabrication of magnetic recording heads because of its high electrical conductivity, and is typically electroplated to produce coil turns, electric leads, and interconnects (studs) between different metal layers in a device. In order to plate copper on a substrate, a thin Cu film with a thickness from 500 to 1000 Angstroms is first sputtered on a wafer surface to serve as a plating seed. Next, a photoresist layer is coated on the Cu seed layer and is patternwise exposed and developed by a conventional lithography method to form a photoresist mask. During the copper plating step, copper is deposited on regions of the substrate that are not protected by the photoresist mask. Subsequently, the photoresist mask is removed by an organic solvent such as NMP. Then, ion milling is used to remove the plating seed in regions previously covered by the photoresist mask to prevent shorting in the resulting devices.

One factor that may affect the quality of a plated copper film is the plating seed layer. In particular, copper is known to be easily oxidized in air to form copper oxide on the surface of copper films. The thickness of copper oxide can vary depending on the dwell time between seed layer deposition and plating, and the nature of up stream process conditions such as ashing for photoresist scum removal prior to copper seed layer activation. Copper oxide may cause poor adhesion of a photoresist mask layer when copper oxide reacts with aqueous base developer during patterning of the photoresist layer. Thus, portions of the protective photoresist mask may lift off or peel to cause defects. In addition, copper oxide can affect surface wettability and thereby degrade plating uniformity. Copper oxide at a copper seed/copper plated film interface can affect coil resistance and hence lower the performance of magnetic recording heads. Therefore, it is very important to remove copper oxide from seed layers before performing copper plating.

Several methods are disclosed in the prior art with regard to copper oxide removal or the so-called activation of the seed layer prior to plating. A commonly used method as disclosed in U.S. Pat. No. 5,482,174 is the application of diluted sulfuric acid or hydrochloric acid, or a combination of one of the aforementioned strong acids with a weak acid. Although this treatment is effective in removing surface copper oxide, a problem is that the copper beneath the oxide surface layer is also etched away by the strong acid. As a result, thinned portions of the copper seed layer may affect plating uniformity. Furthermore, aggressive etching by the strong acid can undercut the photoresist mask and cause lifting of the layer. In extreme cases, strong acids may etch completely through the copper seed layer and attack underlying device features if they are exposed without cathodic protection.

Referring to FIG. 1, an example of an abnormal coil resistance pattern caused by acid activation is depicted. Coil resistance is shown as a function of location (x, y coordinate) on the wafer surface (200 mm diameter). In this example, coil resistance is in the range of 2.8 to 3 ohms in lighter regions 60 around the outer portion of the wafer but is 20% to 30% lower in darker region 61 (left center portion) and in region 62 in the lower right center of the wafer. To overcome this issue, strong acid may be replaced by water vapor which improves the wettability of copper plating seed and eliminates the fish eye issue associated with plating feature devices. However, water vapor is not effective in removing copper oxide and an improved method is still needed that avoids over etching the copper seed layer, improves plating, and reduces the volume of chemical consumption involved with a conventional seed layer activation process which requires as much as 200 ml or more of acid/water mixture per wafer.

Dry etch methods have been practiced in the art as described in U.S. Pat. No. 6,033,584 where a hydrogen plasma treatment is used to remove copper oxide. In U.S. Pat. No. 6,734,102, an in-situ plasma reducing process is disclosed to remove copper oxides and comprises a compound of nitrogen and hydrogen such as ammonia. Unfortunately, plasma tools are quite expensive and typically generate residues that require additional cleaning steps.

SUMMARY OF THE INVENTION

One objective of the present invention is to provide a method for removing copper oxide on copper seed layers that is selective to oxide and does not etch the underlying copper layer thereby avoiding wafer loss (scrap wafers) due to overetching.

Another objective of the present invention is to provide a method for activating a copper seed layer that improves surface wettability for copper plating and improves plating uniformity compared with prior art methods.

Yet another objective of the present invention is to reduce chemical consumption required for activating a copper seed layer for subsequent copper plating.

According to one embodiment of the present invention, these objectives are realized by first providing a substrate comprised of a substructure on which a copper seed layer has been formed. A photoresist layer is coated on the copper seed layer, patternwise exposed, and then developed by a conventional method to generate a photoresist mask that covers portions of the copper seed layer not to be electroplated in a later step. The substrate is then transferred by a wafer handling system, for example, to a process tool for seed layer activation of portions of the substrate exposed by the photoresist mask. In one aspect, the process tool may comprise a spinner with a vacuum chuck inside a spin bowl. A cover is placed over the spin bowl to provide a closed chamber to contain a vapor during the activation process. An ultrasonic wave nebulizer is connected to the process chamber through an opening in the spin bowl or in the cover portion. Thus, a flow of vapor is allowed to flow into the chamber above the bowl and to contact a substrate that is held on the chuck. The nebulizer is commercially available and is pre-programmed to deliver a weak organic acid/water vapor at a certain flow rate.

During a first step of the process sequence of the present invention, a substrate is transferred to the chuck on a spinner. A vaporized weak acid/water mixture is then generated by the nebulizer and fed into the process chamber through at least one opening in the chamber. Vapor activation is preferred over a liquid stream of weak acid/water or immersing the substrate in a solution since the nebulizer vapor has a higher energy state and enhances the rate of copper oxide removal compared with a liquid solution. Moveover, vapor temperature is less than or equal to room temperature and thereby avoids a thermal shock to the photoresist mask which prevents cracking. Preferably, the weak acid is organic and has a vapor pressure proximate to that of water. Weak organic acids that have a satisfactory vapor pressure are acetic acid, lactic acid, formic acid, citric acid, oxalic acid, and uric acid. The weak acid/water vapor is preferably applied while the substrate is spinning. Typically, the time each substrate is exposed to the weak acid/vapor is between 30 and 60 seconds, and the volume of weak acid/vapor applied to each substrate is dependent on the ultrasonic frequency and power. At the end of the first process step which is also referred to as the activation step, the flow of vapor from the nebulizer is terminated by closing the one or more openings or stopping the vapor generation process in the nebulizer, for example.

In a second process step that preferably occurs using the same spinner as in the first step, a certain volume of water is applied to the substrate by a nozzle, for example, to rinse any remaining weak acid and other residues from the surface and to remove the cloud of weak acid/water vapor from the chamber. The substrate is spun during the rinse step and the spin motion removes essentially all of the water from the substrate.

Thereafter, the substrate is removed from the process chamber by the wafer handling system and sent to a plating cell where copper is electroplated on copper seed regions that are not protected by the photoresist mask. Subsequently, standard methods are used to remove the photoresist mask and the copper seed layer adjacent to electroplated copper features.

DETAILED DESCRIPTION OF THE INVENTION

Figure 1:
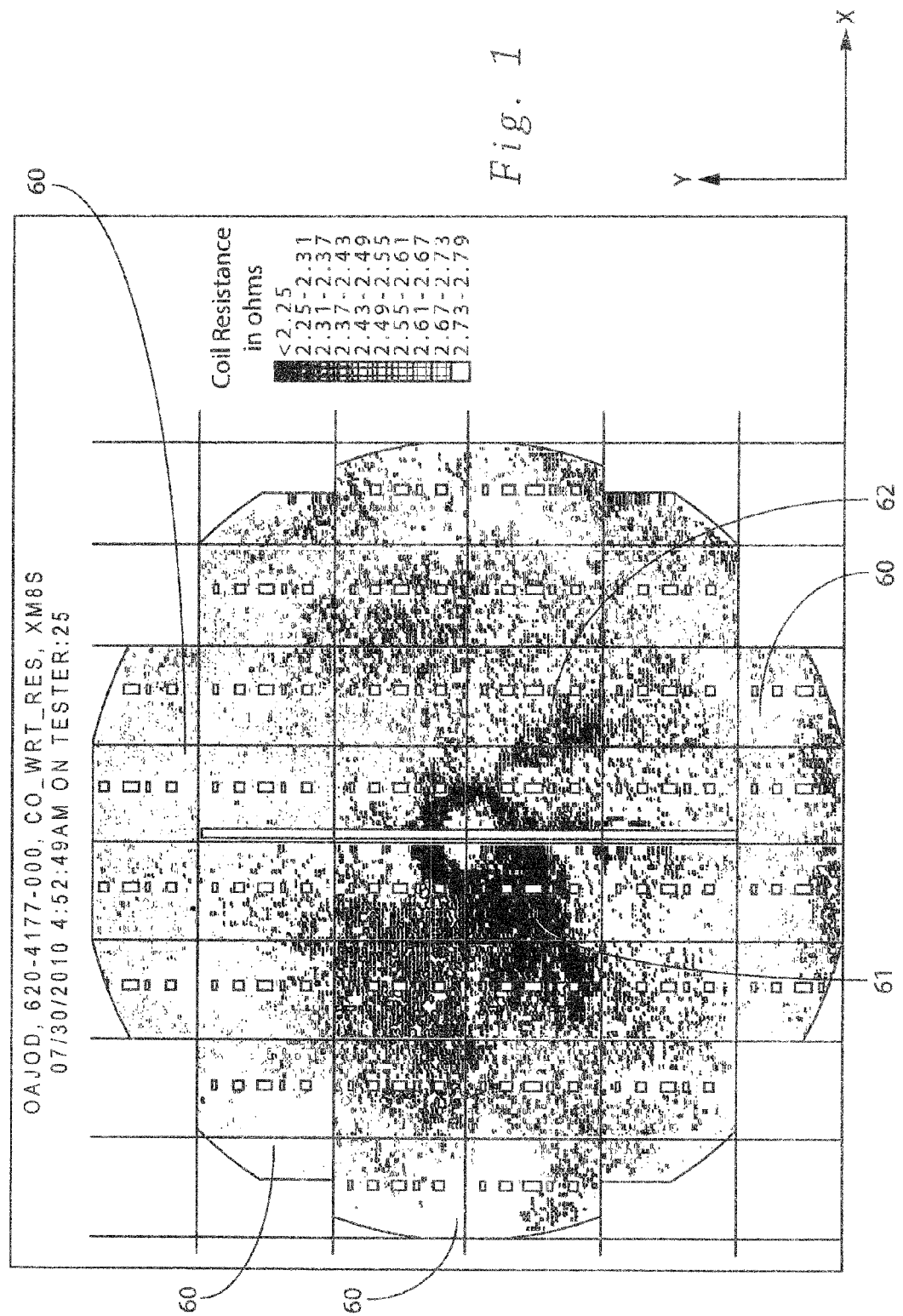
FIG. 1 is a top-down view of a wafer surface after a conventional copper seed layer activation process that shows non-uniformity in copper coil resistance where resistance varies as a function of location on the wafer.

The present invention is a copper plating process that provides improved plating uniformity, and in particular relates to copper seed layer activation immediately prior to the copper plating step. The terms "substrate" and "wafer" may be used interchangeably. In the context of the present invention, copper plating may be employed to form coils in magnetic heads as well as electrical leads and interconnects in microelectronic devices. The relative dimensions of the features depicted in the drawings are not necessarily drawn to scale and may vary from one device to another.

To eliminate the over-etching issue associated with strong acid treatment of copper seed layers for copper oxide removal, we have considered the use of a weak acid treatment. Furthermore, the shortcomings of the prior art weak acid treatment methods are addressed for an improved method to be successfully incorporated in a manufacturing scheme. A detailed mechanism for the reaction of copper oxide with acetic acid is provided by K. Chavez and D. Hess in "A Novel Method of Etching Copper Oxide Using Acetic Acid", J. Electrochem. Soc., 148 (11) G640-G643 (2001). One drawback of weak acids is that copper oxide removal is too slow for the level of throughput needed in a manufacturing environment. Secondly, there are non-uniformity problems that arise when a stream of acid solution is directed at a substrate surface and forcefully impacts features thereon. In addition, non-uniformity is influenced by the topography of the features in the photoresist mask that surround exposed copper seed surfaces. Thus, surface wettability may still be an issue. Unfortunately, adding surfactant to improve wettability is not a viable option since the additive may change electrical resistance of a subsequently plated copper film due to the inclusion of breakdown components.

We have discovered a copper seed activation method that overcomes the aforementioned problems associated with weak acid solutions. The key feature of the method disclosed herein is a weak acid/water vapor which is applied to a substrate surface by an ultrasonic wave nebulizer. Vaporized weak acid has a higher energy state than a stream of acid solution which accounts for a higher copper oxide removal rate than previously realized. Moreover, the water component of the vapor is responsible for simultaneously improving surface wettability. U.S. Pat. No. 4,850,534 teaches the working principles of an ultrasonic wave nebulizer which basically generates a high frequency vibration next to a liquid reservoir to form aerosol droplets that can be directed toward a substrate. In this case, we have advantageously used a nebulizer to form vapor comprising a mixture of water and weak organic acid molecules. Thus, the small size of the droplets which may reach less than 5 microns in diameter, and the high energy imparted to the droplets from the high frequency vibration are responsible for the enhanced rate of copper oxide removal on a copper substrate, and improved penetration between small photoresist features (topography) in the photoresist mask to enhance wettability. We have found that the preferred weak acids include but are not limited to the following organic acids which are acetic acid, lactic acid, formic acid, citric acid, uric acid, and oxalic acid. Preferred weak acids have a vapor pressure proximate to that of water which is 23.8 torr at 20° C., and have a pKa of about 4 to 6. Stronger acids with a pKa<4 may cause undesirable copper etching and weaker acids with pKa>6 are generally ineffective in copper oxide removal at desired process temperatures in the range of 20° C. to 25° C.

Figure 2:
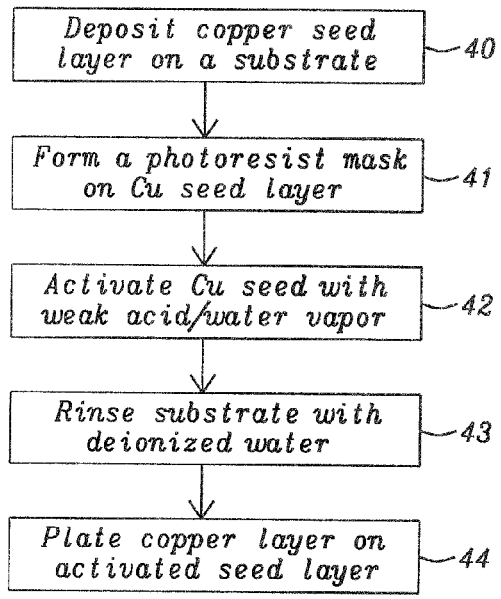
FIG. 2 is a flow diagram showing a copper plating sequence according to a method of the present invention.
Figure 3:
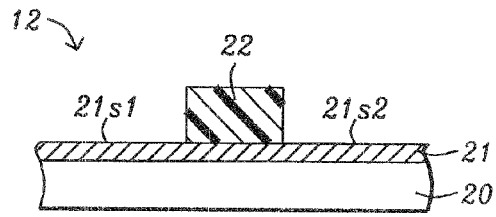
FIG. 3 is a cross-sectional view of a substrate on which a copper seed layer and photoresist mask are formed according to an embodiment of the present invention.

Referring to FIG. 2, a process flow diagram is illustrated that shows the sequence of steps in a copper plating process according to one embodiment of the present invention. In step 40, a copper seed layer is deposited on a substrate and in step 41 a photoresist layer is patterned to form a mask on the copper seed layer as represented by the exemplary embodiment shown in FIG. 3. The work piece 12 comprises the substrate 20 and all layers formed on the substrate including copper seed layer 21 and photoresist mask feature 22. Note that substrate 20 may be comprised of a metal layer or a dielectric layer, for example, and may be formed on a sub-structure (not shown) that includes other devices such as a read head in a merged read/write head product. In one embodiment, the substrate is made of AlTiC. A photoresist mask layer has been patterned by a conventional method to form a photoresist mask feature 22 and thereby uncover top surface regions 21s1, 21s2 of copper seed layer 21. It should be understood that there are typically a plurality of features 22 formed in a photoresist layer but the drawing has been simplified to point out the key aspects of the copper seed activation step.

Figure 4:
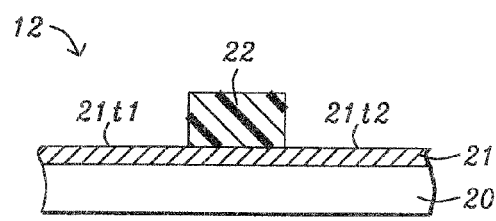
FIG. 4 is a cross-sectional view of the substrate in FIG. 3 after exposed portions of the copper seed have been activated according to an embodiment of the present invention.

In step 42 and FIG. 4, a key step in the process of the present invention is the copper seed activation step. As explained in more detail in a later section, the work piece 12 is positioned on a wafer chuck in a spin bowl, for example, and is treated with weak acid/water vapor applied from an ultrasonic wave nebulizer through one or more openings in a process chamber. In one embodiment, a tube connects the nebulizer to the process chamber and thereby enables vapor to be transported from the source to the reaction site at the surface of the work piece. Preferably, a cover is placed over the spin bowl during vapor application to contain the vapor within the process chamber. Thus, the process chamber is considered to include the spin bowl and the air space between the spin bowl and cover. The surface regions 21s1, 21s2 are exposed to a cloud of weak acid/water vapor for a certain amount of time, and preferably while the work piece 12 is spinning on the chuck in the spin bowl to allow a uniform distribution of vapor within the process chamber. As a result, copper oxide (not shown) formed on top surface regions 21s1, 21s2 during the dwell time between copper seed layer deposition and activation is effectively removed by step 42 to leave unoxidized copper seed layer surfaces 21t1, 21t2. Thereafter, rinse step 43 is performed to remove weak acid residues and is comprised of a stream of deionized water directed at the surface of the work piece 12 while still on the wafer chuck in the same spin bowl. The work piece is preferably rotated on the wafer chuck during rinse step 43 to improve the efficiency of weak acid/water vapor removal. Typically, the spin bowl has an opening at the bottom (not shown) that allows waste liquid to flow to a waste container for subsequent disposal.

Figure 5:
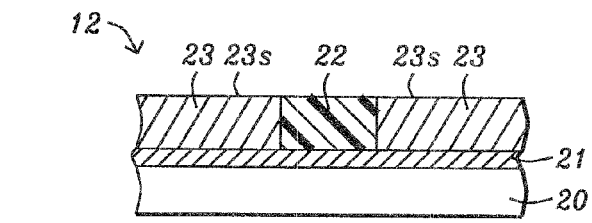
FIG. 5 is a cross-sectional view of the substrate in FIG. 4 after copper has been plated on activated portions of the copper seed.

Referring to step 44 (FIG. 2) and FIG. 5, the work piece 12 is preferably transferred immediately to a copper plating solution (not shown) where copper layer 23 is plated on copper seed layer 21. Photoresist mask 22 covers a portion of copper seed layer that is not to be plated. Step 44 may further comprise a chemical mechanical polish (CMP) process that is employed after the electroplating step to form an essentially planar top surface 23s on copper layer 23.

Figure 6:
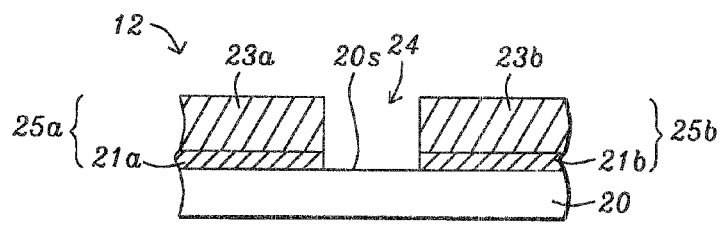
FIG. 6 is a cross-sectional view of the substrate in FIG. 5 after the photoresist mask is removed and exposed portions of the copper seed are etched away.

Referring to FIG. 6, photoresist mask 22 is removed by a conventional method and then exposed portions of copper seed layer 21 are removed by an ion milling process to form an opening 24 between adjacent copper features 23a, 23b, and between copper seed layer sections 21a, 21b. A portion of the substrate surface 20s is uncovered so that there is no electrical connection between sections 21a, 21b. Therefore, a first stack 25a that includes copper feature 23a and copper seed layer section 21a may represent a first device feature, and a second stack 25b which comprises copper feature 23b and copper seed layer section 21b may represent a second device feature such as two copper studs or lines (wires) in a damascene scheme. Alternatively, device features 25a, 25b may be adjacent turns in a copper coil within a magnetic write head. Subsequently, a dielectric layer (not shown) may be formed between device features 25a, 25b as an additional isolation measure to prevent "crosstalk" between adjacent copper structures carrying electrical current.

Figure 7:
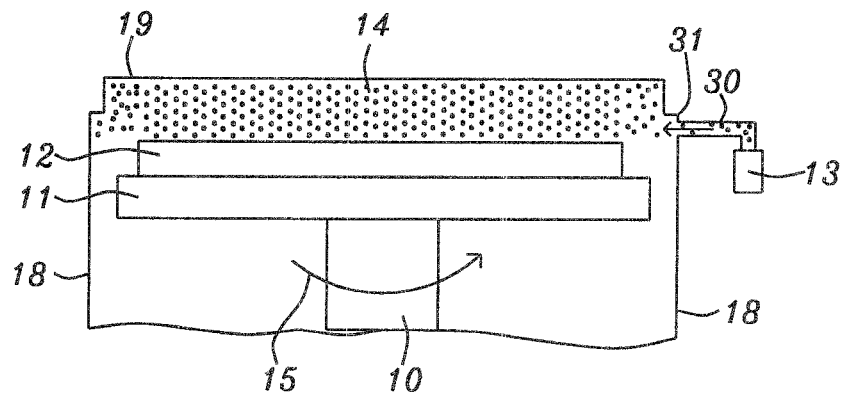
FIG. 7 is a cross-sectional view depicting a substrate being treated with a weak acid/water vapor mixture from an ultrasonic wave nebulizer during an activation step according to a method of the present invention.

Referring to FIG. 7, a side view of a spinner 10 having an upper pedestal or chuck 11 that holds a work piece 12 in place during a rotational movement 15 within a spin bowl 18 is shown. Typically, vacuum is applied through one or more openings (not shown) in a top surface of the chuck 11 to hold the work piece in position. According to the present invention, copper seed layer activation step 42 as described previously comprises application of a weak acid/water vapor 14 generated from an ultrasonic wave nebulizer 13 and transported through a tube 30 that is connected to one or more openings 31 in a process chamber comprising spin bowl and cover 19. The vapor flows into the chamber and contacts work piece 12. During the vapor application time which is preferably from 30 to 60 seconds, the vapor 14 is typically not visible on the surface of the work piece but is believed to form a continuous monolayer on exposed copper seed layer regions (not shown). The nebulizer 13 is commercially available and model NE-U17 from Omron Matsusaka Co., Ltd. Japan was used to demonstrate the effectiveness of the method of the present invention.

The process tool (station) which includes spinner 10 and chuck 11 may be part of an automated track system where wafers (work pieces) are transferred from one process station to the next with robotic arms that are controlled by a computer. Automated track systems for copper seed activation and copper plating may contain multiple Cu plating stations for each copper seed activation station since the plating process normally requires a longer process time than a seed layer activation process. Furthermore, the speed and duration of the spinner rotational movement 15, rate and volume of weak acid/water vapor application, and other associated process parameters as appreciated by those skilled in the art may be pre-programmed into the automated track computer system. Note that the weak acid/water ratio in the vapor 14 is dependent on the pKa and the vapor pressure of the weak acid, and the application rate/volume of the vapor is determined by the ultrasonic frequency and power which may be independently set on a controller (not shown) for the nebulizer. In a preferred embodiment, acetic acid is employed as the weak acid and the acetic acid/water ratio in the vapor generated by the nebulizer 13 is from 0.5:1 to 1:1, and more preferably 0.8:1. The weak acid and water may be premixed in the desired ratio before filling a reservoir in the ultrasonic wave nebulizer. Although the temperature of the vapor is not controlled, formation of the vapor 14 has a cooling effect and the temperature of the vapor contacting the work piece 12 is believed to be in the range of 20° C. to 25° C. Therefore, the activation method as described herein avoids a thermal shock to the photoresist mask and prevents photoresist crack defects that can occur if a heated acid solution is used for copper oxide removal.

As a result of the weak acid/water application described herein in which a cloud of nebulizer vapor contacts all work piece surfaces with equal strength in terms of acid concentration and impact force, copper oxide removal is uniform across the work piece and not localized as observed with prior art acid injection methods. Furthermore, vapor activation prevents the weak acid etchant from being trapped between high aspect ratio (thickness/width) photoresist mask features. In other words, vapor molecules are significantly easier to remove from between adjacent photoresist features than a column of acidic water in conventional methods.

Figure 8:
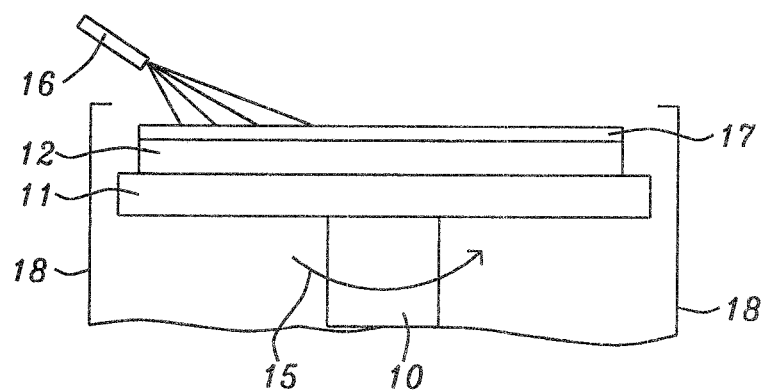
FIG. 8 is a cross-sectional view depicting a substrate being rinsed with DI water following a Cu seed layer activation step according to a method of the present invention.

Referring to FIG. 8, the copper seed activation step of the present invention is followed by at least one rinse step wherein deionized water is applied to work piece 12 following the weak acid/water vapor treatment. According to one embodiment, the rinse step occurs in the same process chamber with the spin bowl and chuck used for the weak acid/water vapor treatment. The water rinse may be applied as a stream of water from a nozzle 16 to form a continuous film of water 17 on the top surface of work piece 12. Note that a cover 19 is not necessary for this step. Spinner 10 along with chuck 11 and work piece 12 are preferably rotated 15 during all of the rinse process time which is generally 30 to 60 seconds in length. As a result of the rinse and spinning motion, essentially all water as well as acid residues are removed from the surface of work piece 12.

Figure 9:
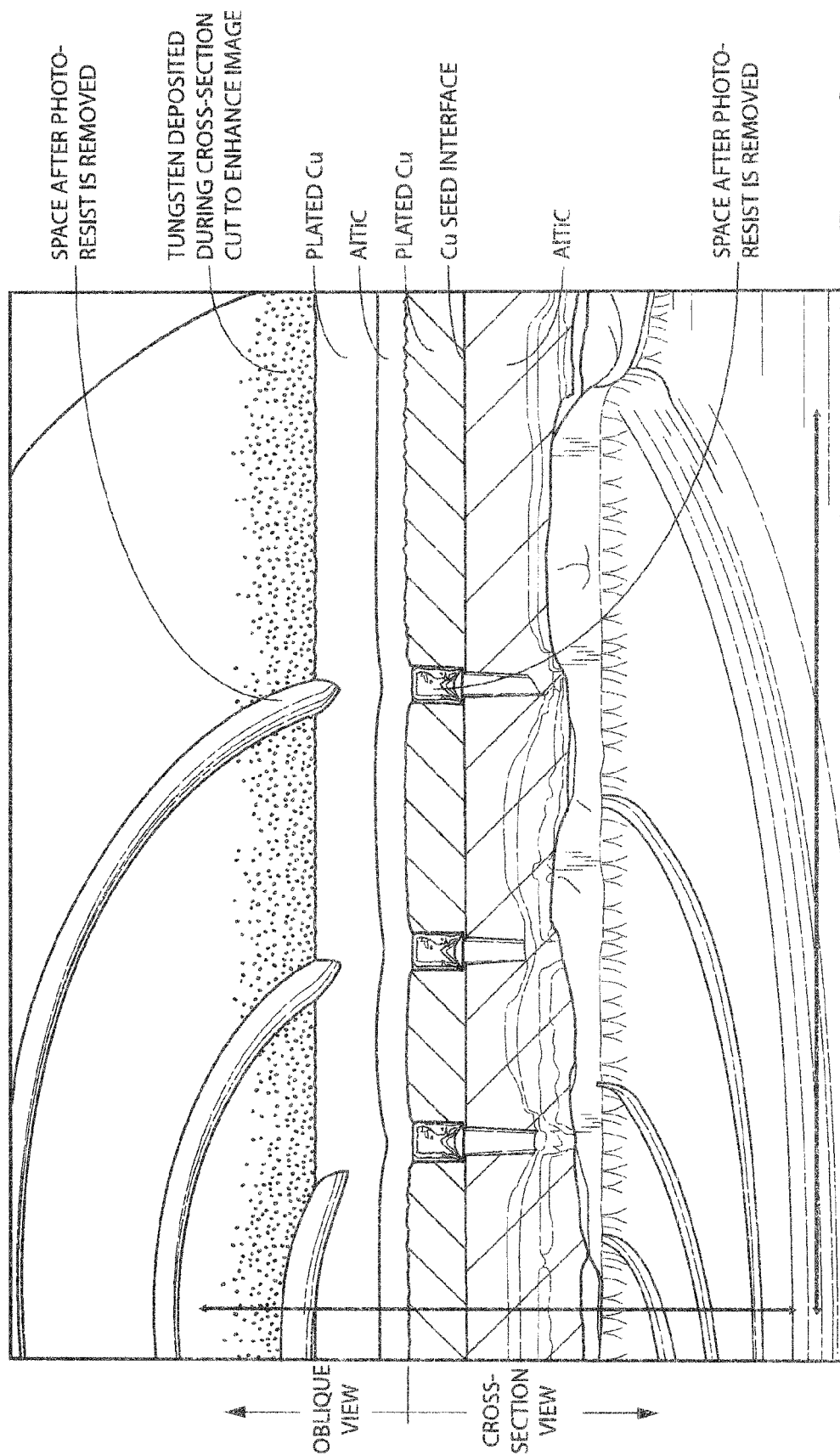
FIG. 9 are scanning electronic microscope images showing an oblique view (top) and a cross-sectional view (bottom) of plated coils that were formed by the copper plating process sequence outlined in FIG. 2.

Referring to FIG. 9, an oblique view (top) is positioned directly above a cross-sectional view (bottom) of a plated copper coil structure that was produced by a process flow according to a method of the present invention represented in FIG. 2. The pictures were taken by a scanning electron microscope (SEM). There is an AlTiC substrate, a plated copper layer, and a thin copper seed layer (not easily visible) at the interface between the aforementioned layers. In this case, a thin tungsten film was deposited on the chip after the cross-sectional cut through the wafer in order to enhance the SEM image which is taken with the chip mounted on a stand in a high vacuum chamber within the SEM tool. Openings are shown where a photoresist masking layer was removed between copper coils after copper deposition.

The copper plating process as disclosed herein has been found to provide uniform copper oxide removal across the surface of a copper seed layer while enhancing surface wettability that leads to a more uniform electrical resistance of a plated copper film. There is also considerable savings in chemical consumption since vapor applied from a nebulizer requires significantly less volume of acid etchant/water mixture than used for acid injection methods. Typically, less than 10 ml of weak acid/water mixture per wafer is used during copper seed activation by the vapor application of the present invention compared with 200 ml or more of acid/water solution per wafer consumed during conventional methods. Furthermore, process yield is increased as a result of fewer wafers that are rejected because of overetching issues. Thus, overall fabrication cost for producing copper structures such as vias, wires, and coils is lowered as a benefit of implementing the copper plating process of the present invention.

While this invention has been particularly shown and described with reference to, the preferred embodiment thereof, it will be understood by those skilled in the art that various changes in form and details may be made without departing from the spirit and scope of this invention.

We claim:

1. A method of removing copper oxide from copper surfaces, comprising:
    (a) providing a substrate on which a copper layer with a top surface has been formed;
    (b) applying vapor consisting of water and a weak organic acid at a temperature of about 20 to 25° C. to said top surface, said vapor is generated by an ultrasonic wave nebulizer; and
    (c) rinsing the top surface of said copper layer with deionized water.

2. The method of claim 1 wherein the ultrasonic wave nebulizer is pre-programmed to provide a certain flow rate of the weak organic acid/water vapor.

3. The method of claim 1 wherein the substrate is rotated during steps (b) and (c).

4. The method of claim 1 wherein the weak organic acid is one of acetic acid, lactic acid, formic acid, citric acid, uric acid, and oxalic acid.

5. The method of claim 1 wherein the weak organic acid is acetic acid and the vapor comprises a weak acid/water ratio between about 0.5:1 and 1:1.

6. The method of claim 1 wherein the weak organic acid has a pKa from about 4 to 6.

7. The method of claim 1 wherein the vapor is transported from the ultrasonic wave nebulizer through a tube and an opening into a process chamber comprised of a spin bowl and a cover to contain said vapor within the process chamber during treatment of the substrate.

8. The method of claim 1 wherein weak organic acid/water vapor contacts said top surface for a period of about 30 to 60 seconds during the vapor application step.

9. The method of claim 1 wherein deionized water contacts said top surface for a period of 30 to 60 seconds during the rinsing step.

10. The method of claim 1 wherein steps (b) and (c) are performed within a single process chamber.

* * * * *